United States Patent
Ngo et al.

(10) Patent No.: US 6,642,619 B1
(45) Date of Patent: Nov. 4, 2003

(54) SYSTEM AND METHOD FOR ADHESION IMPROVEMENT AT AN INTERFACE BETWEEN FLUORINE DOPED SILICON OXIDE AND TANTALUM

(75) Inventors: Minh Van Ngo, Fremont, CA (US); Dawn Hopper, San Jose, CA (US); Jeremy Martin, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/614,300

(22) Filed: Jul. 12, 2000

(51) Int. Cl.⁷ .................. H01L 23/48; H01L 23/52; H01L 29/40
(52) U.S. Cl. .................. 257/753; 257/750; 257/751; 257/761; 257/762
(58) Field of Search .................. 257/750–753, 257/762, 768, 761; 438/687, 627, 628, 643, 644, 648, 653, 654, 656, 685, 783, 300–307, 392, 394, 395, 418, 419, 420, 449–451, 495, 501, 505–509, 513–523

(56) References Cited

U.S. PATENT DOCUMENTS 6,177,364 B1 * 1/2001 Huang .................. 438/792

* cited by examiner

Primary Examiner—Ha Tran Nguyen
(74) Attorney, Agent, or Firm—Renner, Otto, Boisselle & Sklar, LLP

(57) ABSTRACT

A Fluorine doped Silicon Oxide ($SiO_2$)/Tantalum interface and method for manufacturing the same are provided that ensure the structural integrity of integrated circuits that include a Fluorine doped Silicon Oxide structure and a corresponding Tantalum barrier layer. The Fluorine doped Silicon Oxide ($SiO_2$)/Tantalum interface comprises an amount of Silicon Nitride (SiN) in a surface region of a Fluorine doped Silicon Oxide structure. The concentration of Fluorine in the surface region is depleted with respect to a concentration of Fluorine in the remaining portion(s) of the Fluorine doped Silicon Oxide structure. The Fluorine doped Silicon Oxide ($SiO_2$)/Tantalum interface also includes an amount of Tantalum Nitride (TaN) in the surface region. Finally, a Tantalum barrier layer is deposited over the surface region.

7 Claims, 4 Drawing Sheets

SYSTEM AND METHOD FOR ADHESION IMPROVEMENT AT AN INTERFACE BETWEEN FLUORINE DOPED SILICON OXIDE AND TANTALUM

TECHNICAL FIELD

The present invention generally relates to the manufacture of microdevices, and, more particularly, to the manufacture of various structures within such microdevices.

BACKGROUND OF THE INVENTION

In the manufacture of microdevices and integrated circuits, various structures are formed on appropriate substrates using various techniques including deposition and photolithography. As is known in the art, there are a multitude of structures and/or electrical components that may be created, including transistors, pins, vias, etc., that make up circuits that perform the functionality of a particular integrated circuit and/or microdevice. There are many different chemical materials employed in the making of these structures and/or electrical components. For example, Copper may often be employed to provide electrically conductive pathways in a particular integrated circuit. Various materials may also be employed as insulators, etc.

Many different materials are used to create the various structures within integrated circuits depending upon their physical and electrical properties. In some cases, two particular materials used in the manufacture of an integrated circuit are kept separated by so called barriers to prevent unwanted reaction and diffusion. Two such materials that are so separated include Fluorine doped Silicon Oxide ($SiO_2$) and Copper (Cu).

To explain further, a structure comprising Fluorine doped $SiO_2$ is often formed on an appropriate substrate in a Plasma Enhanced Chemical Vapor Deposition (PECVD) System by introducing Tetrafluoro-Silane ($SiF_4$) and Tetraethylorthosilicate ($C_8H_{20}Si$) into the PECVD chamber in the presence of an appropriate radio-frequency (RF) signal or other precursors in a High Density PECVD system. The Fluorine doped $SiO_2$ structure may comprise, for example, a layer structure with vias that are etched where appropriate as is known in the art.

In the case where vias are etched into the Fluorine doped $SiO_2$ structure, the particular integrated circuit may include Copper pins that are formed within the vias to act as electrically conductive pathways using appropriate electroplated Copper metallization techniques. Unfortunately, when Copper comes into direct contact with Fluorine doped Silicon Oxide, the Copper molecules tend to enter into the Fluorine doped Silicon Oxide by way of diffusion, thereby resulting in undesirable alteration of the properties of the Fluorine doped Silicon Oxide.

To prevent such diffusion, a barrier layer of Tantalum (Ta) may be placed between the Fluorine doped Silicon Oxide structure and the Copper (Cu) to act as a Copper barrier to prevent such diffusion. Unfortunately, conventional interfaces between Fluorine doped Silicon Oxide structures and Tantalum barrier layers lack structural integrity. Specifically, the Fluorine retained in the Silicon Oxide tends to retain moisture that negatively affects the adhesion between the Tantalum barrier and the Fluorine doped Silicon Oxide. Consequently, the structural integrity of integrated circuits that include such an interface is compromised.

SUMMARY OF THE INVENTION

In light of the forgoing, the present invention provides a Fluorine doped Silicon Oxide ($SiO_2$)/Tantalum interface and method for manufacturing the same that ensure the structural integrity of integrated circuits that include a Fluorine doped Silicon Oxide structure and a corresponding Tantalum barrier layer. Accordingly, the Fluorine doped Silicon Oxide ($SiO_2$)/Tantalum interface comprises an amount of Silicon Nitride (SiN) in a surface region of a Fluorine doped Silicon Oxide structure. The concentration of Fluorine in the surface region is depleted with respect to a concentration of Fluorine in the remaining portion(s) of the Fluorine doped Silicon Oxide structure. The Fluorine doped Silicon Oxide ($SiO_2$)/Tantalum interface also includes an amount of Tantalum Nitride (TaN) in the surface region. Finally, a Tantalum barrier layer is deposited over the surface region.

The present invention can also be viewed as providing a method for manufacturing Fluorine doped Silicon Oxide ($SiO_2$)/Tantalum interface. In this regard, the method can be broadly summarized by the following steps: treating a surface region of a Fluorine doped Silicon Oxide structure to allow an amount of Tantalum (Ta) to adhere thereto, and, depositing an amount of Tantalum (Ta) over the surface region.

The Fluorine doped Silicon Oxide ($SiO_2$)/Tantalum interface of the present invention provides distinct advantages. For example, by virtue of the existence of the Fluorine doped Silicon Oxide ($SiO_2$)/Tantalum interface, there is greater adherence between the Tantalum barrier layer and the Fluorine doped Silicon Oxide structure that ultimately results in greater structural integrity in the resulting integrated circuit. Also, the Silicon Nitride within the Fluorine doped Silicon Oxide ($SiO_2$)/Tantalum interface provides a Fluorine barrier to prevent the migration of Fluorine therethrough. Additionally, the underlying manufacturing steps taken to generate the Fluorine doped Silicon Oxide ($SiO_2$)/Tantalum interface may be performed in-situ with preceding manufacturing steps taken to create an integrated circuit structure. Consequently, existing manufacturing facilities may be employed during the manufacture of the Fluorine doped Silicon Oxide ($SiO_2$)/Tantalum interface, thereby reducing cost. Also, the steps taken during the manufacture of the Fluorine doped Silicon Oxide ($SiO_2$)/Tantalum interface are easily integrated into conventional manufacturing procedures.

Other features and advantages of the present invention will become apparent to one with skill in the art upon examination of the following drawings and detailed description. It is intended that all such additional features and advantages be included herein within the scope of the present invention.

BRIEF DESCRIPTION OF THE SEVERAL VIEWS OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

Figure 1:
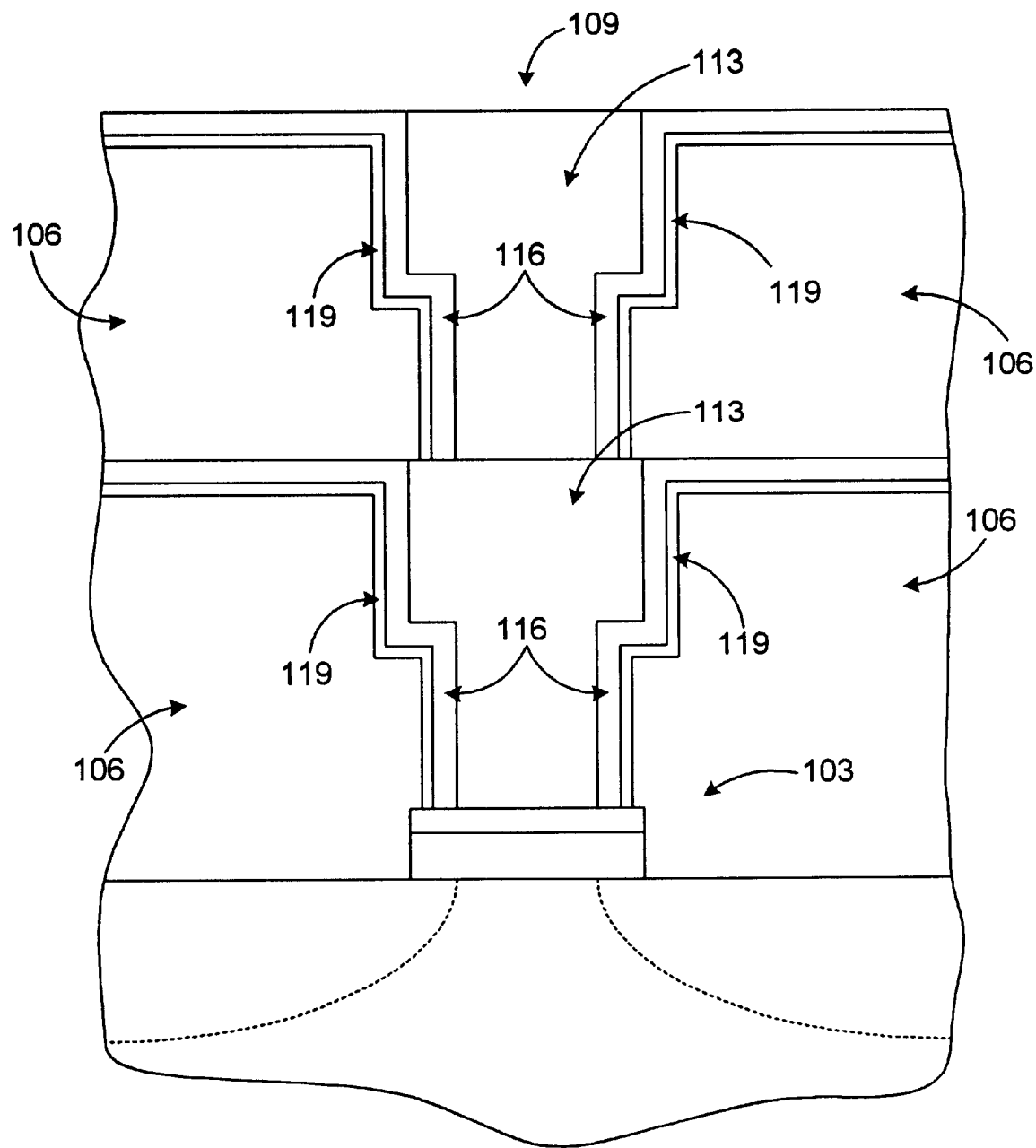
FIG. 1 is a side section view of a transistor structure using the Fluorine doped Silicon Oxide ($SiO_2$)/Tantalum interface according to an embodiment of the present invention.

With reference to FIG. 1, shown is an integrated circuit structure 100 according to the embodiment of the present invention. The integrated circuit structure 100 includes an exemplary transistor structure 103. Also, the integrated circuit structure 100 includes two Fluorine doped Silicon Oxide structures 106 in the form of layers over the transistor structure 103. As shown, there are two vias 109 that have been etched into the layers of Fluorine doped Silicon Oxide 106 above the transistor structure 103. The vias 109 are filled with Copper (Cu) 113 to provide a lead, for example, to the gate of the transistor structure 103.

To insure that the Copper 113 does not diffuse into the Fluorine doped Silicon Oxide structure 106, a Tantalum barrier layer 116 is deposited between the Copper 113 and the Fluorine doped Silicon Oxide structure 106. To adhere the Tantalum barrier layer 116 to the Fluorine doped Silicon Oxide structure 106, the integrated circuit structure 100 includes a Fluorine doped Silicon Oxide/Tantalum interface that comprises a surface region 119 of the Fluorine doped Silicon Oxide structure 106.

It is understood that the transistor structure 103 shown in the integrated circuit structure 100 is exemplary of any number of different types of structures that may use a Fluorine doped Silicon Oxide structure 106 in conjunction with Copper 113, thereby requiring the Tantalum barrier layer 116 and the interface provided by the surface region 119. The transistor structure 103 is thus shown as an example to aid in the discussion of the present invention.

Figure 2:
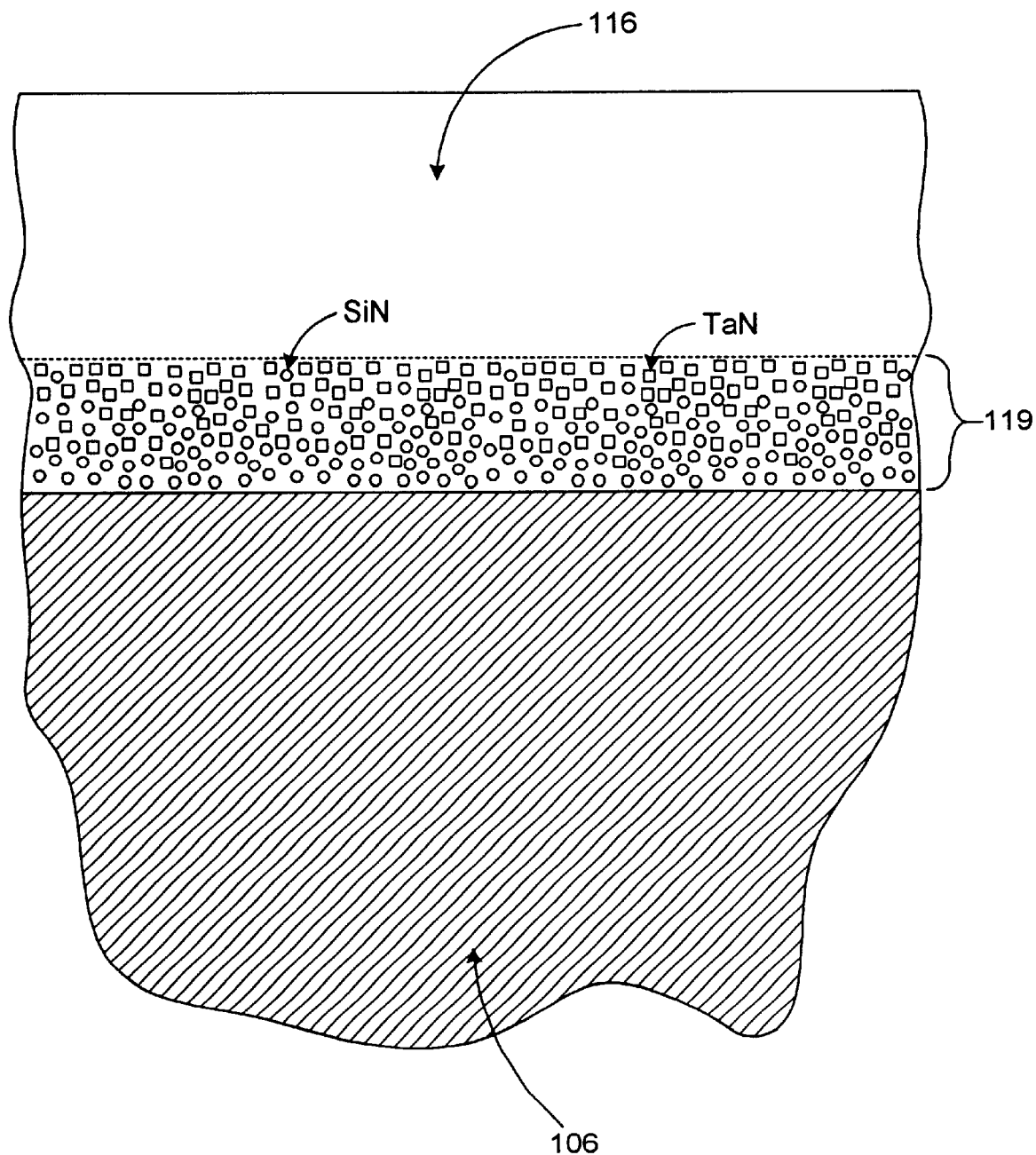
FIG. 2 is a side section view of the Fluorine doped Silicon Oxide ($SiO_2$)/Tantalum interface of FIG. 1.

Turning to FIG. 2, shown is a sectional view of a portion of the Fluorine doped Silicon Oxide structure 106 and the Tantalum barrier layer 116 with the surface region 119 therebetween. Note although the Tantalum barrier layer 116 is indicated as a layer, it is understood that it may be any particular amount of Tantalum or any sort of Tantalum structure deposited on the Fluorine doped Silicon Oxide structure 106.

The surface region 119 of the Fluorine doped Silicon Oxide structure 106 has been depleted of Fluorine. The surface region 119 also includes concentrations of Silicon Nitride SiN and Tantalum Nitride TaN. The Silicon Nitride SiN advantageously acts as a Fluorine barrier to prevent the migration of Fluorine molecules from the Fluorine doped Silicon Oxide therethrough. Also, the Tantalum Nitride TaN provides for adhesion between the Fluorine doped Silicon Oxide structure 106 and the Tantalum barrier layer 116. Note that the concentrations of Silicon Nitride SiN and Tantalum Nitride TaN are not uniform across the entire volume of the surface region 119. In particular, there is generally a greater concentration of Silicon Nitride SiN at the lower portion of the surface region 119 and a greater concentration of Tantalum Nitride TaN at the upper portion of the surface region 119. The actual concentrations of Silicon Nitride SiN and Tantalum Nitride TaN in the surface region 119 may vary depending upon the precise steps taken to create the surface region 119.

With reference to FIGS. 3A through 3D, shown is a progression of steps taken to create the surface region 119 (FIG. 2). First, referring to FIG. 3A, the Fluorine doped Silicon Oxide structure 106 is depicted. Within the Fluorine doped Silicon Oxide structure 106 are a number of molecules of Fluorine F. In the first step, the Fluorine doped Silicon Oxide structure 106 has either already been formed or is created using an appropriate deposition process in the chamber of a plasma enhanced chemical vapor deposition system using Tetrafluoro-Silane ($SiF_4$) and Tetraethylorthosilicate ($C_8H_{20}Si$). Alternatively, the first step may involve the etching of vias in a preexisting Fluorine doped Silicon Oxide structure 106 as known by those skilled in the art. In general such deposition may occur within the chamber of a plasma enhanced chemical vapor deposition system, and the etching is performed in an appropriate etch chamber.

Given that the Fluorine doped Silicon Oxide structure 106 is created, the creation of the surface region 119 begins by treating a surface of the Fluorine doped Silicon-Oxide structure 106 with Ammonia $NH_3$. The Ammonia treatment of the Fluorine doped Silicon Oxide structure 106 preferably occurs in the chamber of the plasma enhanced chemical vapor deposition system after the Fluorine doped Silicon Oxide structure 106 has been deposited on an appropriate substrate or in an etch chamber after appropriate vias have been etched therethrough. The Ammonia treatment is advantageously performed in-situ in the chamber of the plasma enhanced chemical vapor deposition system. Consequently, the Ammonia treatment is easily integrated into existing production procedures. Alternately, the Ammonia treatment can be performed in a separate system, such as a photoresist stripping tool.

The Ammonia treatment in the chamber may last anywhere from 5 to 20 seconds at which time Nitrogen N and Hydrogen H in the Ammonia $NH_3$ are separated and react with the Silicon Si and Fluorine F in the Fluorine doped Silicon Oxide structure 106 to form Silicon Nitride SiN and Hydrogen Fluoride HF. The Hydrogen Fluoride HF that is formed is volatile and, consequently, is pumped out of the chamber. As a result, the Fluorine F is depleted from a surface region 119 of the Fluorine doped Silicon Oxide structure 106.

Figure 3A:
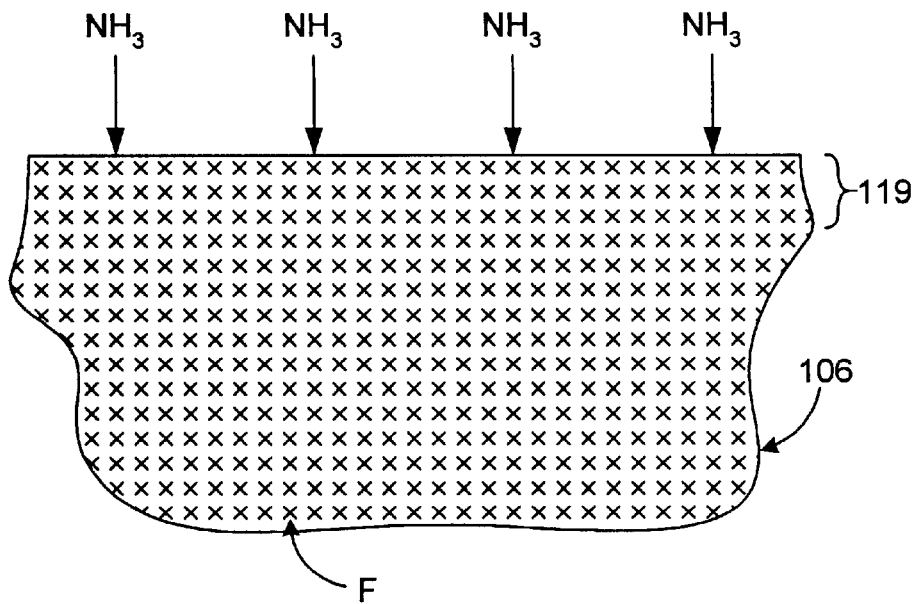
FIG. 3A is a side section view showing an Ammonia ($NH_3$) treatment of a Fluorine doped Silicon Oxide structure according to an embodiment of the present invention.
Figure 3B:
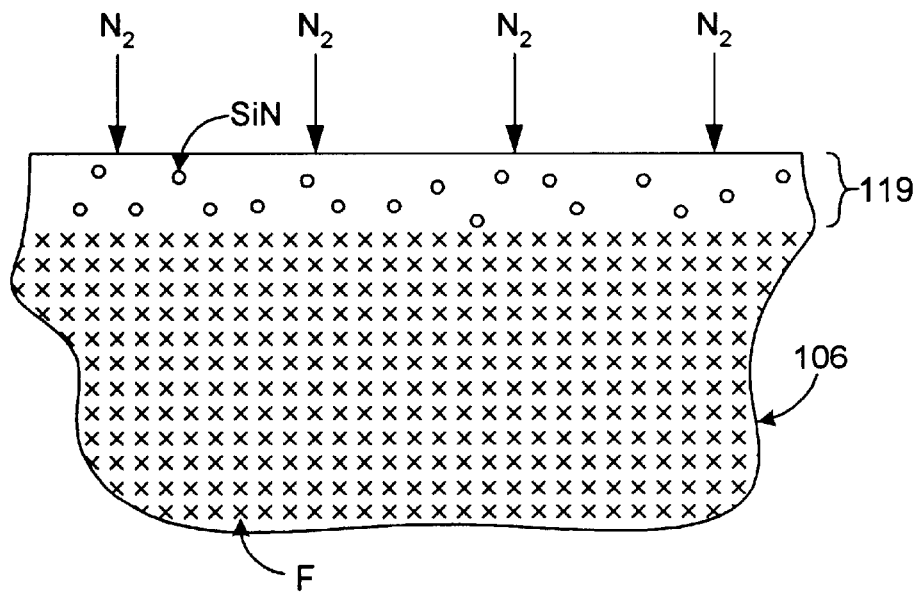
FIG. 3B is a side section view showing a Nitrogen ($N_2$) treatment of the Fluorine doped Silicon Oxide structure of FIG. 3A.

Turning to FIG. 3B, we see the resulting surface region 119 that is formed by the depletion of the Fluorine F after the Ammonia treatment as discussed with reference to FIG. 3A. Also, an amount of Silicon Nitride SiN is formed in the surface region 119 as shown. The Silicon Nitride SiN may reach a depth into the Fluorine doped Silicon Oxide structure 106 of from 100 to about 150 angstroms, although greater or lesser depths may occur depending on the duration of the Ammonia treatment and other factors.

As seen in FIG. 3B, in the next step the surface region 119 undergoes a Nitrogen $N_2$ treatment in the chamber of the plasma enhanced chemical vapor deposition system for approximately 5 to 20 seconds. The Nitrogen $N_2$ treatment leaves a Nitrogen seed in the surface region 119 to create Tantalum Nitride as will be discussed. Also, the Nitrogen N2 treatment causes the continued formation of Silicon Nitride SiN within the surface region 119. The generation of more Silicon Nitride SiN is beneficial to provide for the Fluorine barrier as discussed previously. The Nitrogen $N_2$ treatment is preferably performed in-situ after the Ammonia treatment, thereby facilitating the easy integration of the Nitrogen $N_2$ treatment into existing production procedures using existing production facilities.

Figure 3C:
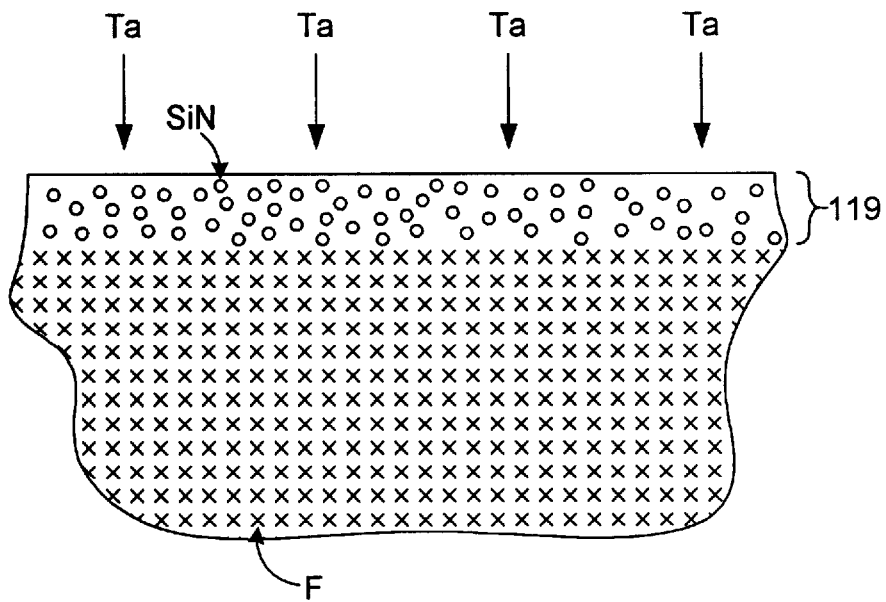
FIG. 3C is a side section view showing a deposition of Tantalum (Ta) of the Fluorine doped Silicon Oxide structure of FIG. 3B.

Next, with reference to FIG. 3C, a Tantalum metal diffusion is performed over the surface region 119 as shown. As a result of the Tantalum metal diffusion, an amount of Tantalum Nitride TaN is formed in the surface region 119 due to reaction with the existing Nitrogen N due to the seeding of Nitrogen in the prior Nitrogen treatment. The Tantalum Nitride TaN provides for greater adhesion between the Fluorine doped Silicon Oxide structure 106 and the Tantalum barrier layer 116 that is deposited thereon.

Figure 3D:
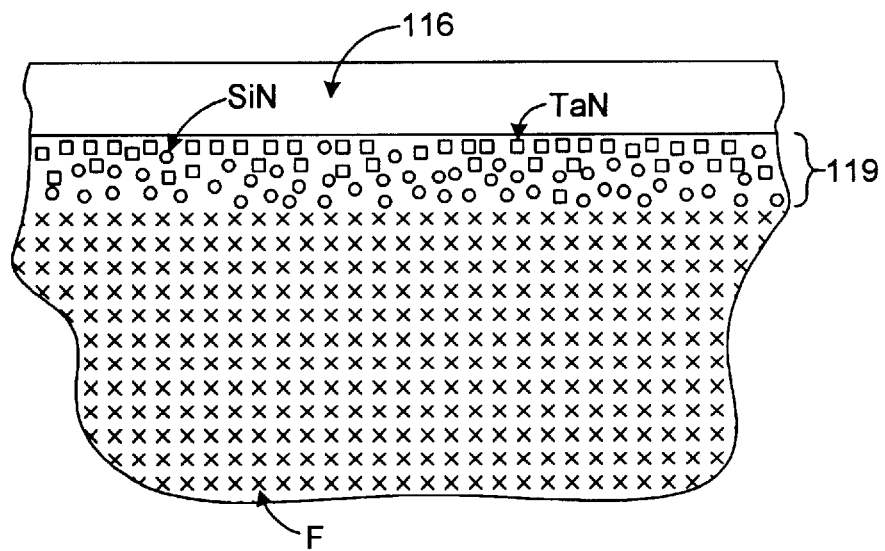
FIG. 3D is a side section view of a Fluorine doped Silicon Oxide structure with the deposition of a barrier layer of Tantalum (Ta) resulting from the Tantalum deposition of FIG. 3C.

Finally, with reference to FIG. 3D, shown is the completed structure that results after the Tantalum metal diffusion. In particular, a certain amount Tantalum Nitride TaN is located within the surface region 119 and the Tantalum barrier layer 116 is formed as discussed previously.

The interface provided by the surface region 119 provides significant advantages over conventional interfaces. In particular, the adhesion between the Tantalum barrier layer 116 and the Fluorine doped Silicon Oxide structure 106 is greatly improved and, consequently, the structural integrity of the resulting integrated circuit is thus greatly improved. Also, the Silicon Nitride SiN within the surface region 119 acts as a Fluorine barrier.

Finally, the Ammonia treatment and the Nitrogen treatments may be performed in-situ in the chamber of the plasma enhanced chemical vapor deposition system or in an etching system after a prior step of depositing the Fluorine doped Silicon Oxide structure 106 or after etching vias in the Fluorine doped Silicon Oxide structure 106. The Ammonia treatment and the Nitrogen treatments may also be performed in-situ after other appropriate steps as known by those skilled in the art, depending upon the precise structure that is to be created. Consequently, the surface region 119 may be created using existing manufacturing equipment, where the Ammonia and Nitrogen treatments are easily integrated into existing manufacturing processes.

In addition to the foregoing, many variations and modifications may be made to the above-described embodiment(s) of the invention without departing substantially from the spirit and principles of the invention. All such modifications and variations are intended to be included herein within the scope of the present invention.

What is claimed is:

1. A Fluorine doped Silicon Oxide ($SiO_2$)/Tantalum interface, comprising:
    a surface region of a Fluorine doped Silicon Oxide structure having a depleted amount of Fluorine as a result of treating the Fluorine doped Silicon Oxide structure with an amount of Ammonia ($NH_3$);
    an amount of Silicon Nitride (SiN) in the surface region of the Fluorine doped Silicon Oxide structure, the Silicon Nitride (SiN) being formed by treating the surface region with an amount of Nitrogen ($N_2$);
    an amount of Tantalum Nitride (TaN) in tie surface region, wherein the amount of Tantalum Nitride (TaN) is formed due to a reaction between an amount of Tantalum (Ta) and an amount of Nitrogen ($N_2$) in the surface region, the amount of Tantalum being deposited over the surface region,
    wherein a greater concentration of the amount of Silicon Nitride (SiN) is adjacent an upper portion of a non-fluorine depleted region of the Fluorine doped Silicon Oxide structure as compared to a concentration of the amount of Silicon Nitride (SiN) in an upper region of the surface region.

2. The interface of claim 1, wherein the amount of Silicon Nitride (SiN) in the surface region further comprises a Fluorine barrier.

3. The interface of claim 1, wherein the amount of Tantalum Nitride (TaN) further comprises an adhesion interface between the Fluorine doped Silicon Oxide structure and the amount of Tantalum (Ta).

4. The interface of claim 1, wherein treatment of the Fluorine doped Silicon Oxide structure with the amount of Ammonia is performed in situ.

5. The interface of claim 1, wherein formation of the Silicon Nitride through treatment with the amount of Nitrogen is performed in situ.

6. An interface region of a Fluorine doped Silicon-Oxide structure, comprising:
    a nitrided region interposed between a barrier layer and a Fluorine doped Silicon-Oxide region of the Fluorine doped Silicon-Oxide structure,
    wherein the nitrided region is adjacent the Fluorine doped Silicon-Oxide region,
    wherein the nitrided region includes:
        an amount of Silicon Nitride (SiN); and
        an amount of Tantalum Nitride (TaN), and
    wherein a concentration of the amount of Silicon Nitride (SiN) adjacent the Fluorine doped Silicon-Oxide region is greater than a concentration of the amount of Silicon Nitride (SiN) in an upper region of the nitrided region.

7. An interface region of a Fluorine doped Silicon-Oxide structure, comprising:
    a nitrided region interposed between a barrier layer and a Fluorine doped Silicon-Oxide region of the Fluorine doped Silicon-Oxide structure,
    wherein the nitrided region is adjacent the Fluorine doped Silicon-Oxide region,
    wherein the nitrided region is a graded region,
    wherein the nitrided region includes:
        an amount of Silicon Nitride (SiN); and
        an amount of Tantalum Nitride (TaN), and
    wherein a concentration of the amount of Silicon Nitride (SiN) increases from a concentration of the amount of Silicon Nitride (SiN) in an upper region of the nitrided region to a greater concentration of the amount of Silicon Nitride (SiN) adjacent the Fluorine doped Silicon-Oxide region, and
    wherein a concentration of Tantalum Nitride (TaN) increases from a concentration of the amount of Tantalum Nitride (TaN) in a lower region of the nitrided region to a greater concentration of Tantalum Nitride (TaN) adjacent the barrier layer.

* * * * *